(12) United States Patent
Binder

(10) Patent No.: US 9,949,405 B2
(45) Date of Patent: Apr. 17, 2018

(54) ELECTRICAL DEVICE

(71) Applicant: Mahle International GmbH, Stuttgart (DE)

(72) Inventor: Tobias Binder, Stuttgart (DE)

(73) Assignee: Mahle International GmbH (DE)

( * ) Notice: Subject to any disclaimer, the term of this patent is extended or adjusted under 35 U.S.C. 154(b) by 44 days.

(21) Appl. No.: 15/017,567

(22) Filed: Feb. 5, 2016

(65) Prior Publication Data

US 2016/0233597 A1    Aug. 11, 2016

(30) Foreign Application Priority Data

Feb. 6, 2015   (DE) .................. 10 2015 202 142

(51) Int. Cl.
*H05K 7/20*    (2006.01)

(52) U.S. Cl.
CPC .................. *H05K 7/2049* (2013.01)

(58) Field of Classification Search
CPC ...... H05K 7/2049; H05K 7/205; H01L 23/40; H01L 23/4093
USPC ............ 361/704–719; 257/718–719; 24/458, 24/459, 520; 411/107, 353; 248/220.21, 248/222.2, 222.14, 560; 165/80.2–80.3
See application file for complete search history.

(56) References Cited

U.S. PATENT DOCUMENTS

| | | | | |
|---|---|---|---|---|
| 4,972,294 A | * | 11/1990 | Moses, Jr. ........... | H01L 23/4093 165/80.3 |
| 5,321,582 A | * | 6/1994 | Casperson ........... | H05K 7/2049 257/709 |
| 5,486,981 A | * | 1/1996 | Blomquist .......... | H01L 23/4093 165/185 |
| 5,602,719 A | * | 2/1997 | Kinion ................ | H01L 23/4093 165/185 |
| 5,801,929 A | * | 9/1998 | Cheng ................. | H05K 7/1023 361/783 |
| 5,869,897 A | * | 2/1999 | Leighton ............. | H01L 23/40 257/714 |
| 6,081,424 A | * | 6/2000 | Mach .................. | H05K 7/20436 165/185 |
| 6,108,207 A | * | 8/2000 | Lee ..................... | H01L 23/4093 165/80.2 |

(Continued)

FOREIGN PATENT DOCUMENTS

DE         69400254 T2    10/1996
DE         19543260 A1     5/1997
(Continued)

OTHER PUBLICATIONS

English abstract for DE-202006009643.
English abstract for DE-19543260.
German Search Report for DE-102015202142.4, dated Sep. 17, 2015.

*Primary Examiner* — David M Sinclair
*Assistant Examiner* — Robert Brown
(74) *Attorney, Agent, or Firm* — Fishman Stewart PLLC

(57) ABSTRACT

An electrical device may include a housing, a printed circuit board arranged in the housing, an electrical component arranged in electrical contact with the printed circuit board, and a clamp. The clamp may be configured to bias the electrical component against a cooling structure disposed in the housing and hold the printed circuit board in the housing relative to the housing. The clamp may include a clamp snap-in structure forming at least part of a snap-in connection with the housing.

20 Claims, 2 Drawing Sheets

(56) References Cited

U.S. PATENT DOCUMENTS

| | | | |
|---|---|---|---|
| 6,225,559 B1 | 5/2001 | Hubner et al. | |
| 6,229,705 B1* | 5/2001 | Lee | H01L 23/4093 165/80.3 |
| 6,256,199 B1* | 7/2001 | Yusuf | H01L 23/40 165/185 |
| 6,266,244 B1* | 7/2001 | Guthrie | H01L 23/40 165/80.3 |
| 6,343,013 B1* | 1/2002 | Chen | H01L 23/4093 165/185 |
| 7,564,687 B2* | 7/2009 | Liu | H01L 23/4093 165/185 |
| 8,893,770 B2* | 11/2014 | Gamborg | H01L 23/4093 165/185 |
| 2002/0154487 A1 | 10/2002 | Weischhoff Van Rijn | H05K 9/006 361/719 |
| 2006/0176672 A1* | 8/2006 | Kamemoto | H05K 7/2049 361/714 |
| 2006/0187643 A1* | 8/2006 | Tsurufusa | H05K 7/2049 361/704 |
| 2008/0024995 A1* | 1/2008 | Tien | H01L 21/4882 361/710 |
| 2009/0251865 A1* | 10/2009 | Tamori | H05K 7/2049 361/707 |
| 2012/0140417 A1* | 6/2012 | Aspas Puertolas | H05K 7/2049 361/709 |
| 2012/0218712 A1* | 8/2012 | Hayashi | H05K 7/2049 361/704 |
| 2012/0300403 A1* | 11/2012 | Scholeno | H01R 13/6595 361/702 |
| 2013/0033823 A1* | 2/2013 | Nagashima | B60T 7/042 361/714 |
| 2014/0008504 A1* | 1/2014 | Kottmyer | H01L 23/4093 248/221.11 |
| 2014/0146481 A1* | 5/2014 | Subat | H05K 7/20445 361/720 |
| 2014/0321064 A1* | 10/2014 | Bose | H01L 23/4093 361/720 |
| 2015/0116940 A1* | 4/2015 | Kim | H05K 1/0203 361/700 |
| 2016/0044825 A1* | 2/2016 | Baer | H05K 7/20436 361/714 |
| 2016/0286687 A1* | 9/2016 | Tajima | H05K 7/2049 |

FOREIGN PATENT DOCUMENTS

| | | |
|---|---|---|
| DE | 19722602 A1 | 12/1998 |
| DE | 202006009643 U1 | 8/2006 |

\* cited by examiner

ELECTRICAL DEVICE

CROSS-REFERENCE TO RELATED APPLICATIONS

This application claims priority to German Patent Application No. 10 2015 202 142.4, filed Feb. 6, 2015, the contents of which are hereby incorporated by reference in its entirety.

TECHNICAL FIELD

The present invention relates to an electrical device having a housing and a printed circuit board as well as an electric component.

BACKGROUND

Electrical devices are used in a variety of applications. They usually serve for electrically connecting and/or controlling components of the associated application. These applications include, for example, pumps, controllers and the like, which can be used in particular in motor vehicles.

Such electrical devices usually have a housing in which a printed circuit board and at least one electric component electrically contacting the printed circuit board are arranged. Here, it is often necessary to cool such an electric component since it generates heat during the operation of the electric device.

Such an electrical device is known from DE 195 43 260 C2. This device has a housing and a printed circuit board assembled with electrical components. The electrical components are biased against the housing by means of a spring element extending through the printed circuit board so as to enable better cooling. The disadvantage here is that the spring element extending through the printed circuit board needs a recess within the printed circuit board, which results in additional work steps and in difficult access to the spring element.

DE 20 2006 009 643 U1 shows another such electrical device in which the electrical component is biased against a cooling structure of the housing by means of a clamp. Furthermore, the clamp holds the printed circuit board in the housing relative to the housing. For this purpose, the clamp and the printed circuit board have recesses and receptacles, respectively, by means of which the clamp and the printed circuit board are screwed to the housing. The disadvantage of this device is that the printed circuit board has corresponding recesses. Moreover, a plurality of screw connections is necessary in order to hold the printed circuit board in the housing.

SUMMARY

The present invention is therefore concerned with the problem of providing for an electrical device of the aforementioned kind an improved or at least another embodiment which is in particular characterized by simplified assembly and/or the possibility of simplified maintenance.

This problem is solved according to the invention by the subject matter of the independent claim(s). Advantageous embodiments are subject matter of the dependent claims.

The present invention is based on the general idea of providing the electrical device with a clamp that can be connected to the housing by means of a snap-in connection so as to, on the one hand, hold a printed circuit board in the housing relative to the housing and, on the other, to bias an electrical component against a cooling structure of the housing. Using such a snap-in connection allows implementing holding the printed circuit board in the housing and biasing the electrical component against the housing in a simple manner by means of the clamp. In particular, assembling the printed circuit board and/or the electrical component in the housing is simplified in this manner. Disassembling the printed circuit board and/or the electrical component can also be simplified in this way, so that, for example, performing maintenance of the electrical device can be simplified. In particular, this makes it possible to dispense with the recesses within the printed circuit board.

The solution according to the invention also allows dispensing with non-positive connections, in particular screws.

According to the inventive idea, the electrical device thus includes the housing and the printed circuit board which is arranged in the housing. The electrical component is in electric contact with the printed circuit board and, for example, serves for electrically supplying and/or controlling further components which can be part of the electrical device or part of other applications. The clamp clamps the electrical component in the assembled state against a cooling structure of the housing and holds the printed circuit board in the housing relative to the housing. According to the invention, it is provided that the clamp has a clamp snap-in structure which forms such a snap-in connection with the housing. The snap-in connection is preferably configured to be releasable such that establishing the snap-in connection as well as releasing the snap-in connection can be carried out in a simple and/or quick manner.

In order to implement the snap-in connection, the housing preferably has a complementary snap-in structure which is associated with the clamp snap-in structure and which is designated below as housing snap-in structure. Thus, the snap-in connection is implemented by the interaction between the clamp snap-in structure and the housing snap-in structure.

Such a snap-in connection is in particular characterized in that it represents a positive-locking connection between the housing and the clamp, the positive-locking connection preferably being releasable.

Furthermore, preferred are variants in which the clamp and the housing are connected to one another exclusively in a positive-locking manner. Moreover, preferred are configurations in which the printed circuit board is also connected to the housing and/or the clamp exclusively in a positive-locking manner.

In principle, the electrical component can be any component, provided that it serves for supplying and/or controlling further components. The electrical component can be a high-performance component, for example a transistor, in particular a MOSFET.

In preferred embodiments, the clamp rests against the printed circuit exclusively on one side of the printed circuit board. This means in particular that the clamp does not extend through the printed circuit board. Because of this, no corresponding recesses are to be provided in the printed circuit board so that in particular corresponding production steps for providing the printed circuit board with such recesses can be omitted. Also, functional impairments of the printed circuit board and/or the electrical component associated with such recesses are avoided.

Advantageous are configurations in which the clamp is connected to the printed circuit board and/or the housing without screws. Such a connection of the clamp to the printed circuit board and/or the housing results in the fact that no screws are necessary for assembling the clamp and thus for holding the printed circuit board in the housing and/or for biasing the electrical component against the cooling structure of the housing, so that assembly and disassembly can be carried out in a correspondingly simple and quick manner.

In principle, the cooling structure of the housing can be configured as desired, provided that cooling of the electrical component is possible. The cooling structure can in particular be a wall of the housing. The cooling structure can also be a heat exchanger which allows for improved heat exchange between the electrical component and the housing and/or improved heat dissipation from the component. For this purpose, such a cooling structure can be arranged between the electrical component and a wall of the housing, for example.

It is conceivable to provide the clamp with a clamp engagement structure which is in engagement with the housing. Here, such an engagement forms a positive-locking connection between the clamp and the housing. The clamp engagement structure differs from the clamp snap-in structure and is arranged spaced apart therefrom. The clamp engagement structure serves in particular for the purpose of additionally securing the clamp and/or the snap-in connection. For this, the clamp engagement structure can engage in the housing. This can be implemented, for example, in that the housing has a complementary housing engagement structure which is associated with the clamp engagement structure and interacts with the clamp engagement structure in order to implement such an engagement. This means in particular that the clamp engagement structure engages in the housing engagement structure. For this purpose, the housing engagement structure can be implemented, for example, as a recess or a hole in the wall of the housing.

Embodiments in which the clamp surrounds the printed circuit board and/or the electrical component prove to be advantageous. Through this, protection of the printed circuit board and/or the electrical component is achieved or at least improved.

Furthermore, embodiments in which the clamp surrounds the printed circuit board and/or the electrical component in a radiation-insulating manner are also advantageous. Through this, the effect of electromagnetic radiation on the printed circuit board and/or on the electrical component is avoided or at least reduced. For implementing such radiation insulation, the clamp can be made of suitable materials, for example metallic materials.

In a preferred refinement, the clamp has two sections that are connected to one another and extend inclined with respect to one another, each of which has the clamp engagement structure and the clamp snap-in structure, respectively. This means that the clamp has a first clamp section and a second clamp section which extends inclined with respect to the first clamp section, wherein the first clamp section has the clamp engagement structure while the second clamp section has the snap-in structure.

Through this, configurations can be implemented in which assembling the clamp or the printed circuit board and/or the electrical component is carried out in such a manner that, in first instance, the clamp is connected to the housing via the first clamp section and the clamp engagement structure. Subsequently, the snap-in connection is established by connecting the clamp snap-in structure to the housing snap-in structure, i.e. by snapping it in. A reverse order of assembly is also conceivable.

It is advantageous if the electrical component is biased against the housing via the first clamp section while the printed circuit board is arranged between the second clamp section and the housing. During the assembly, provided that the assembly is carried out as described above, first, a contact between the electrical component and the cooling structure and subsequently the biasing of the electrical component against the cooling structure and holding the printed circuit board in the housing takes place.

In preferred embodiments, the clamp is formed to be elastic, in particular spring-loaded. Through this, simple assembling and disassembling the clamp can be implemented. Furthermore, in this way, biasing the electrical component and/or the snap-in connection can be implemented in a simplified manner.

It is principally conceivable that the clamp engagement structure is implemented along the first clamp section. It is advantageous if the clamp engagement structure projects from the first clamp section.

The same applies to the clamp snap-in structure, which can be implemented within the second clamp section. It is advantageous, if the clamp snap-in structure projects from the second clamp section.

For biasing the electrical component against the cooling structure, the clamp can comprise a biasing element which, in the assembled state, biases the electrical component against the cooling structure. Such a biasing element can project from the clamp, for example from the first clamp section. If the biasing element projects from the first clamp section, biasing the electrical component is advantageously implemented via the first clamp section.

In principle, the clamp can hold the printed circuit board in the housing in any way.

For holding the printed circuit board in the housing, the housing can have a ridge which is arranged on the housing side facing the printed circuit board and projects towards the printed circuit board. In the assembled state, the printed circuit board rests against this ridge. Here, the ridge can be formed in any shape. For example, it is conceivable to form the ridge to be continuous, in particular as a rib.

Advantageously, the clamp has a locating element which belongs to the ridge and projects towards the printed circuit board and which pushes the printed circuit board against the housing in order to hold the printed circuit board in the housing relative to the housing.

Alternatively or additionally, the clamp can have at least one holding element for holding the printed circuit board on the clamp. The at least one holding element thus allows in particular that holding the printed circuit board in the housing relative to the housing takes place exclusively via the clamp. For this purpose, the holding element can be provided on a clamp side facing towards the printed circuit board. The holding element can in particular be implemented as a holding structure which holds the printed circuit board on the clamp. This means that the printed circuit board is held on the clamp relative to the clamp by means of the at least one holding element.

It is principally conceivable to design the clamp from multiple parts and to assemble, in particular, connect the parts for forming the clamp. Preferred are variants in which the clamps are formed from one piece, i.e., from one material. For example, it is conceivable to produce the clamp from sheet metal, in particular by shaping the sheet metal. This enables a particularly cost-effective and simple production of the clamp.

For improved cooling of the electrical component it is advantageous if cooling structure's outside facing away from the electrical component, in particular the outside of the associated wall of the housing facing away from the electrical component, is exposed at least in certain regions.

This results in improved heat exchange between the exposed outer side and the surroundings so that improved cooling of the electrical component is possible. It is also conceivable to act on the exposed outside using a cooling medium, for example air and/or a coolant, in order to achieve improved heat dissipation and, accordingly, improved cooling of the electrical component.

The housing generally serves for protecting the printed circuit board and/or the electrical component.

It is advantageous here if the device has a cover that closes the housing. Here, a receiving space of the housing, in which the printed circuit board and/or the electrical component are/is arranged, can be closed by the cover.

Of course, it is conceivable that the device also has two or more such electrical components, wherein at least one of these electrical components is biased against the cooling structure of the housing by means of the clamp. It is also conceivable that at least two such electrical components are biased against the housing by means of the clamp or in each case by means of such a clamp associated thereto.

Further, it conceivable that the device has two such printed circuit boards, wherein at least one of the printed circuit boards is held in the housing relative to the housing by means of the clamp. It is also conceivable that such a clamp is associated with the respective printed circuit board.

To consider is also a variant in which at least two clamps are used, wherein at least one of the clamps is formed according to the invention.

The electrical component can principally be used in any application. It is in particular conceivable to use the electrical device in a motor vehicle. The electrical device can serve, for example, for electrical supply to and/or for controlling any part of the motor vehicle. The device can be, for example, a pump, an air conditioning system and the like, or can serve for supplying and/or controlling them.

Further, it will be appreciated that the clamp can have a plurality of such clamp snap-in structures and/or a plurality of such clamp engagement structures. Also, the clamp can have a plurality of such holding elements and/or locating elements.

Further important features and advantages of the invention arise from the sub-claims, from the drawings and from the associated description of the figures based on the drawings.

It is to be understood that the above-mentioned features and the features still to be explained hereinafter are usable not only in the respective mentioned combination, but also in other combinations or alone, without departing from the context of the present invention.

Preferred embodiments of the invention are illustrated in the drawings and are explained in greater detail in the following description, wherein same reference signs refer to same or similar or functionally identical components.

BRIEF DESCRIPTION OF THE DRAWINGS

In the figures, schematically.

DETAILED DESCRIPTION

Figure 1:
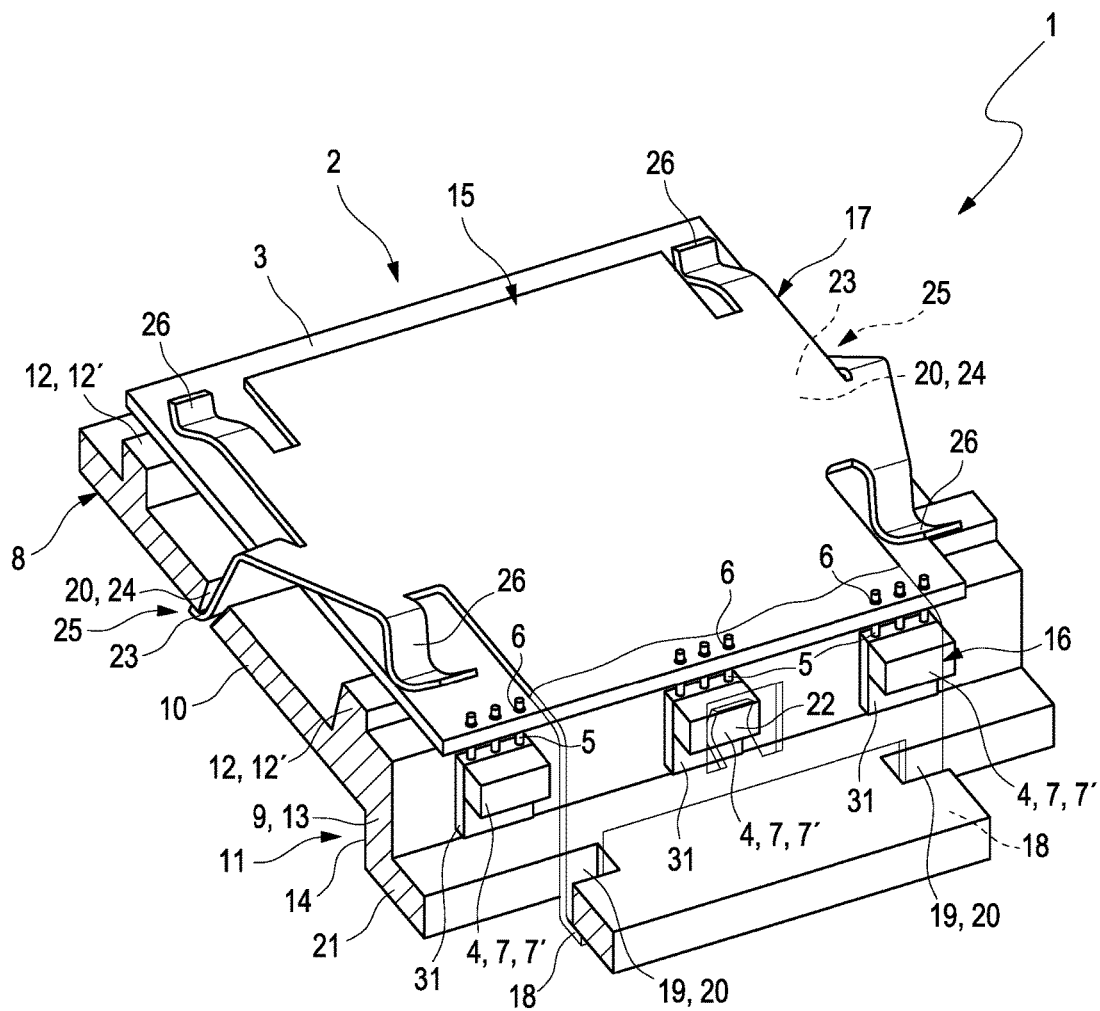
FIG. 1 shows a spatial view of an electrical device.

FIG. 1 shows an electrical device 1 having electronics 2. The electronics 2 comprises a substantially flat printed circuit board 3 and a plurality of electrical components 4. The respective electrical component 4 is electrically contacted with the printed circuit board 3 via pins 5, with the pins 5 being soldered to the printed circuit board 3 via solder joints 6. Here, the electrical components 4 project from the printed circuit board 3. The electrical components 4 are designed, for example, as transistors 7, in particular MOSFETs 7', and serve for electrically supplying and/or controlling a respective application, which is not shown here.

The electrical device 1 further has a housing 8 in which the printed circuit board 3 and the electrical components 4 are arranged, wherein the housing 8 is only partially shown in FIG. 1 for the sake of a better illustration. The housing 8 has two walls 9, 10 which extend inclined with respect to one another and thus form a step 11. A first wall 9 of the housing 8 faces towards the electrical component 4, while a second wall 10 faces towards the printed circuit board 3. On the side facing towards the printed circuit board 3, the second wall 10 and thus the housing 8 has two ridges 12 in the form of ribs 12' which run along the printed circuit board 3 and on which the printed circuit board rests. The first wall 9 forms a cooling structure 13 of the housing 8 against which the electrical components 4 rest for cooling. The outside 14 of the cooling structure 13 or the wall 9, which outside faces away from the electrical components 4, is exposed so that better heat exchange between the cooling structure 13 and the surroundings or a cooling medium flowing around the outside of the cooling structure 13 takes place in order to achieve better cooling of the electrical component 4.

For biasing at least one such electrical component 4 and for holding the printed circuit board 3 in the housing 8 relative to the housing 8, the electrical device 1 further has a clamp 15. The clamp 15 is formed as one piece and from one material, for example from sheet metal. The clamp 15 has a first clamp section 16 which runs along the first wall 9 or the cooling structure 13, and a second clamp section 17 which runs along the printed circuit board 3 and runs inclined with respect to the first clamp section 16. The electrical components 4 are arranged between the first wall 9 or the cooling structure 13 and the first clamp section 16 while the printed circuit board 3 is arranged between the second wall 10 and the second clamp section 17. Here, the first clamp section 16 is illustrated transparently in certain regions in order to make the electrical components 4 and the first wall 9 or the cooling structure 13 visible.

The clamp 15 has clamp engagement structures 18 which are spaced apart from one another and project from the first clamp section 16 and which project at the end of the clamp section's 16 side facing away from the second clamp section 17 from the first clamp section 16 at the end thereof. The clamp engagement structures 18 are arranged at the edge of the clamp 15 and are engaged with the housing 8. For this purpose, the housing 8 has housing engagement structures 19 which are associated with the respective clamp engagement structure 18 and which are formed in the form of recesses 20 in a third wall 21 which projects from the first wall 9 and runs substantially parallel to the second wall 10.

The clamp 15 biases one of the shown electrical components 4 against the cooling structure 13. For this purpose, the clamp 15 is provided in the second clamp section 16 with a biasing element 22 that projects towards the associated electrical component 4. The biasing element 22 is formed to be elastic or spring-loaded and, in the assembled state, pushes the electric component 4 against the cooling structure 13 in order to bias the electrical component 4 against the cooling structure 13. It is also possible to provide the clamp 15 with further such biasing elements 22, each of which biases such an associated electrical component 4 against the cooling structure 13.

The clamp 15 further comprises two clamp snap-in structures 23, each of which interacts with an associate housing-side housing snap-in structure 24 of the housing 8 so as to form a snap-in connection 25.

The housing snap-in structures 23 are arranged at the edge of the clamp 15. The housing snap-in structures 23 project from the second clamp section 17 towards the housing 8 or the printed circuit board 3, thereby laterally passing the printed circuit board 3. Because of this, it is in particular not necessary that the printed circuit board 3 has recesses or the like in order enable a connection of the clamp 15 with the housing 8.

Moreover, the clamp has four locating elements 26 which are arranged symmetrically at the edge, are associated with the ridges 12 and project from the second clamp section 17 towards the printed circuit board 3. The locating elements 26 rest in the region of the ridges 12 against the printed circuit board 3 and push the printed circuit board 3 against the housing 8.

Overall, the printed circuit board 3 is held in the housing 8 relative to the housing 8 by means of the clamp 15, while the electrical component 4 is biased against the cooling structure 13. This is carried out exclusively in a positive-locking manner, wherein in particular no screws and the like are necessary. In addition, no recess or the like extending through the clamp 15 is necessary for implementing the device 1. The clamp 15 is formed in a spring-loaded or elastic manner. The clamp 15 can be detached from the housing 8. Thus, apart from assembly, maintenance on the electronics 2 can also be carried out in a simplified manner.

Figure 2:
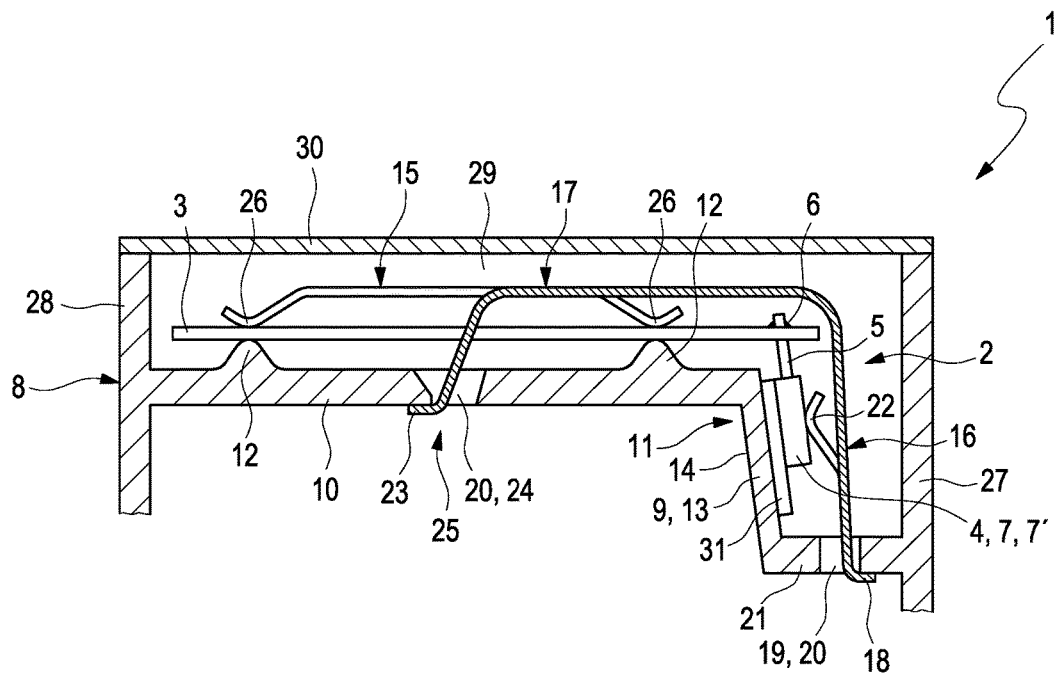
FIG. 2 shows a cross-section through the electrical device of another exemplary embodiment.

FIG. 2 shows another exemplary embodiment of the electrical device 1. This exemplary embodiment differs in particular from that shown in FIG. 1 in that the ridges 12 do not have an angular cross-section, but are rounded. It can be seen that the locating elements 26 are arranged aligned with the associated ridges 12 in such a manner that the printed circuit board 3, in the region of the ridges 12, is pushed against the ridges 12. It can further be seen in FIG. 2 that the housing 8 has further walls 27, 28, wherein the walls 9, 10, 21, 27, 28 define a receiving space 29 of the housing 8 in which the electronics 2 is received. On the clamp's 15 side facing away from the printed circuit board 3, this receiving space 29 is closed by a cover 30 of the electrical device 10. The clamp 15 can be configured such that it surrounds the electronics 2 in a radiation-isolating manner.

It can further be seen in FIG. 2 that a cooling element 31 is arranged between the electrical component 4 and the cooling structure 13. Here, the cooling element 31 is formed to be larger than the electrical component 4 and is configured in a heat conducting manner such that a heat exchange between the electric component 4 and the cooling structure 13 is improved. The cooling element 31 preferably has a higher thermal conductivity than the cooling structure 13 and/or the electrical component 4.

Figure 3:
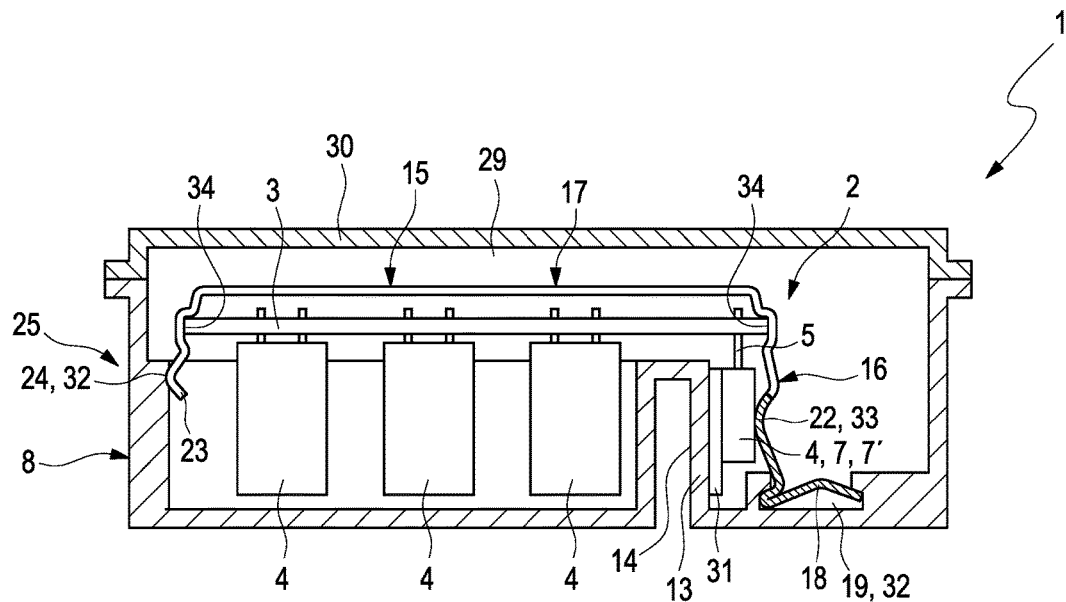
FIG. 3 shows a cross-section through the electrical device of another exemplary embodiment.

Another exemplary embodiment of the electrical device 1 is shown in FIG. 3. In this exemplary embodiment, the housing engagement structure 19 is implemented as an undercut 32, wherein the clamp engagement structure 18 has a shape that is complementary to the undercut 32 such that the clamp engagement structure 18 engages in the undercut 32, as a result of which the clamp engagement structure 18 and the housing engagement structure 19 are in mutual engagement. Moreover, the biasing element 22 in the first clamp section 16 is implemented within the first clamp section 16 in that the first clamp section 16 has a deformation 33 that is concave towards the cooling structure 13. Also, the housing snap-in structure 24 is not implemented as a recess 20 but as an undercut 32.

In the exemplary embodiment shown in FIG. 3, the clamp 15 further has holding structures 34 which face towards the printed circuit board 3 and which receive the printed circuit board 3 and hold it on the clamp 15. As illustrated in FIG. 3, this enables a configuration in which the printed circuit board 3 is arranged without contact to the housing 8 and is held in the housing 8 relative to the housing 8. Here, each of the holding structures 34 can surround the printed circuited board 3 at least in certain regions in order to enable a mounting of the printed circuit board 3 on the clamp 15 that is as stable as possible. Likewise, it is possible to provide only one such holding structure 34, wherein this holding structure 34 surrounds the printed circuit board 3 at least in certain regions, preferably completely.

The exemplary embodiment shown in FIG. 3 further allows a particularly effective radiation-isolating environment of the electronics 2 by means of the clamp 15.

It can further be seen in FIG. 3 that, apart from the electrical component 4 biased against the cooling structure 13, the electronics 2 has further electrical components 4 which are arranged within the receiving space 29.

In the exemplary embodiments shown in FIGS. 1 to 3, connecting the clamp 15 to the housing is carried out exclusively in a positive-locking manner. Moreover, the printed circuit board 3 is not penetrated by the clamp 15.

In all examples shown, the clamp 15 is formed to be elastic, in particular spring-loaded, so that the snap-in connection 25 and/or the engagement between the clamp engagement structure 18 and the housing engagement structure 19 can be easily established or released. Thus, biasing the at least one electric component 4 against the cooling structure 13 can also be implemented in a simplified manner.

The invention claimed is:

1. An electrical device, comprising:
a housing;
a printed circuit board arranged in the housing;
an electrical component arranged in electrical contact with the printed circuit board;
a cooling structure;
a clamp configured to bias the electrical component against the cooling structure and hold the printed circuit board in the housing relative to the housing, wherein the clamp includes a clamp snap-in structure defining at least part of a snap-in connection with the housing;
wherein the housing includes at least a first wall and a second wall that extends inclined with respect to the first wall, the first wall arranged facing towards the electrical component and the second wall arranged facing towards the printed circuit board, and wherein the first wall defines the cooling structure.

2. The device according to claim 1, wherein the clamp rests against the printed circuit board exclusively on one side of the printed circuit board.

3. The device according to claim 1, wherein the clamp is connected to at least one of the printed circuit board and the housing without fasteners.

4. The device according to claim 1, wherein the clamp further includes a clamp engagement structure arranged away from the clamp snap-in structure, the clamp engagement structure configured to engage with the housing.

5. The device according to claim 1, wherein the clamp surrounds at least one of the printed circuit board and the electrical component in a radiation-isolating manner.

6. The device according to claim 1, wherein:
the clamp has a first clamp section which biases the electrical component against the cooling structure,
the clamp has a second clamp section which extends inclined with respect to the first clamp section, and
the first clamp section includes a clamp engagement structure forming an engagement with the housing and the second clamp section includes the clamp snap-in structure.

7. The device according to claim 1, wherein the clamp includes a first clamp section extending along the first wall of the housing defining the cooling structure and a second clamp section extending along the second wall of the housing, and wherein the electrical component is arranged between the first wall and the first clamp section, and the printed circuit board is arranged between the second wall and the second clamp section.

8. The device according to claim 1, wherein the housing includes a ridge on a side facing towards the printed circuit board, and wherein the printed circuit board rests on the ridge.

9. The device according to claim 1, wherein the snap-in connection is further defined by the at least one recess disposed in the housing, and wherein the clamp snap-in structure engages with the at least one recess of the housing.

10. The device according to claim 1, wherein the clamp further includes at least one holding structure facing towards the printed circuit board arranged to hold the printed circuit board on the clamp.

11. The device according to claim 1, wherein the clamp is at least one of formed from one piece and composed of a single material.

12. The device according to claim 1, wherein the cooling structure on an outer side that faces away from the electrical component is exposed at least partially to a surrounding environment.

13. The device according to claim 1, further comprising a cover closing the housing, the cover and the housing together defining a receiving space, and wherein the electrical component and the printed circuit board are disposed in the receiving space.

14. The device according to claim 1, wherein the first wall is coupled to the second wall and provides a step where the first wall extends transversely from the second wall.

15. The device according to claim 1, further comprising a cooling element arranged between the electrical component and the cooling structure, wherein the cooling element is composed of a material having a higher thermal conductivity than at least one of the cooling structure and the electrical component.

16. An electrical device, comprising:
a housing;
a printed circuit board arranged in the housing;
an electrical component arranged in electrical contact with the printed circuit board;
a clamp configured to bias the electrical component against a cooling structure of the housing and hold the printed circuit board in the housing relative to the housing, the clamp including a clamp snap-in structure defining at least part of a snap-in connection with the housing;
the clamp further including a first clamp section that biases the electrical component against the cooling structure, and a second clamp section that extends inclined with respect to the first clamp section; and
wherein the first clamp section includes a clamp engagement structure providing an engagement with the housing and the second clamp section includes the clamp snap-in structure.

17. The electrical device according to claim 16, wherein at least one of the clamp engagement structure projects from the first clamp section and the clamp snap-in structure projects from the second clamp section.

18. The electrical device according to claim 16, wherein the second clamp section holds the printed circuit board in the housing relative to the housing.

19. The electrical device according to claim 16, wherein the cooling structure is provided by a wall of the housing.

20. An electrical device, comprising:
a housing;
a printed circuit board arranged in the housing;
an electrical component arranged in electrical contact with the printed circuit board;
a clamp configured to bias the electrical component against a cooling structure of the housing and hold the printed circuit board in the housing relative to the housing, the clamp including a clamp snap-in structure defining at least part of a snap-in connection with the housing;
wherein the housing includes a ridge on a side facing towards the printed circuit board, and the printed circuit board rests on the ridge; and
wherein the clamp includes a locating element associated with the ridge, and wherein the locating element projects towards the printed circuit board from the clamp and pushes the printed circuit board against the ridge.

* * * * *